United States Patent
Ye et al.

(10) Patent No.: US 7,772,074 B2
(45) Date of Patent: Aug. 10, 2010

(54) METHOD OF FORMING CONFORMAL SILICON LAYER FOR RECESSED SOURCE-DRAIN

(75) Inventors: Zhiyuan Ye, Cupertino, CA (US); Andrew Lam, San Francisco, CA (US); Saurabh Chopra, Sunnyvale, CA (US); Yihwan Kim, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 249 days.

(21) Appl. No.: 11/874,336

(22) Filed: Oct. 18, 2007

(65) Prior Publication Data

US 2009/0104739 A1 Apr. 23, 2009

(51) Int. Cl.
*H01L 21/336* (2006.01)

(52) U.S. Cl. ............. 438/299; 438/197; 438/416; 438/417; 257/E21.431

(58) Field of Classification Search ........... 438/489, 438/486, 197, 299, 416–417; 257/21.431 E
See application file for complete search history.

(56) References Cited

U.S. PATENT DOCUMENTS

| | | | |
|---|---|---|---|
| 6,039,811 A * | 3/2000 | Park et al. ............... | 118/719 |
| 6,395,615 B2 | 5/2002 | Ping | |
| 6,891,232 B2 * | 5/2005 | Miyano et al. ............ | 257/368 |
| 7,364,976 B2 * | 4/2008 | Rachmady et al. ........ | 438/300 |
| 2006/0234504 A1 | 10/2006 | Bauer | |
| 2006/0260538 A1 | 11/2006 | Ye et al. | |

OTHER PUBLICATIONS

"PCT International Search Report—PCT/US 08/11863", (Dec. 22, 2008).

* cited by examiner

*Primary Examiner*—Ha Tran T Nguyen
*Assistant Examiner*—Aaron A Dehne
(74) *Attorney, Agent, or Firm*—Diehl Servilla, LLC

(57) ABSTRACT

Processes for non-selectively forming one or more conformal silicon-containing epitaxial layers on recess corners are disclosed. Specific embodiments pertain to the formation and treatment of epitaxial layers in semiconductor devices, for example, Metal Oxide Semiconductor Field Effect Transistor (MOSFET) devices. In specific embodiments, the formation of a non-selective epitaxial layer involves exposing a substrate in a process chamber to deposition gases including a silicon source such as silane and a higher order silane, followed by heating the substrate to promote solid phase epitaxial growth.

20 Claims, 4 Drawing Sheets

METHOD OF FORMING CONFORMAL SILICON LAYER FOR RECESSED SOURCE-DRAIN

TECHNICAL FIELD

Embodiments of the invention generally relate to the field of electronic manufacturing processes and devices, more particular, to processes for forming silicon-containing layers while forming transistors.

BACKGROUND

Metal Oxide Semiconductor (MOS) transistors include a substrate, a source, a drain and a channel positioned between the source and drain on the substrate. Routinely, a gate stack is located above the channel, the gate stack being composed of a gate oxide layer or gate electrode located directly above the channel, a gate conductor material above the gate oxide layer, and sidewall spacers. The sidewall spacers protect the sidewalls of the gate conductor.

Some transistor source/drain are recessed below the substrate surface and have epitaxy layers of silicon-containing materials deposited thereon, while no epitaxy layers are formed on the dielectric areas. Various processes, such as selective epitaxy, are used to create a silicon-containing epitaxial layer on the source/drain. A typical selective epitaxy process involves a deposition reaction and an etch reaction. During the deposition process, the epitaxial layer is formed on a monocrystalline surface while a polycrystalline layer is deposited on at least a second layer, such as an existing polycrystalline layer and/or an amorphous layer. However, certain selective epitaxy processes, such as silicon carbon (or Si:C), which use stronger etch components, could damage the sidewall of the recessed areas. These selective epitaxy processes generally incorporate a pre-treatment process on the source/drain to improve filling of those recessed areas and to protect their sidewalls.

Typical pre-treatment processes include selectively growing silicon. By selective growth, it is generally meant that the silicon-containing film grows on a substrate which includes more than one material on the substrate surface, and the silicon-containing film selectively grows on a surface a first material of said substrate, with minimal to no growth on a surface of a second material of said substrate. The silicon layer which results from the typical selective growth pre-treatment process is non-conformal, and therefore, weak points in the layer are present, typically on the sidewall. Such non-conformal growth can cause the side wall to become over etched, thereby creating an undercut when etching away the unwanted deposition on the gate top to achieve selectivity. Moreover, non-conformal growth requires longer subsequent depositions to compensate for the weakness in the silicon layer. However, longer depositions also produce thicker silicon layers in other areas where weak points do not exist.

As will be understood by those skilled in the art, weak points can be found in the areas close to the corner of the recess, typically where source/drain extension regions are located. Source/drain extensions are critical for transistor operation since they form the electrical connection between the source/drain and the channel. Any void or defect in this region can result in a dead transistor. Source/drain extensions are generally heavily implanted and, therefore, it is believed that the silicon-containing layers disposed on these regions are more easily etched away. In addition, defects in the source/drain extension area would reduce the stress delivered to the channel by any stressors deposited in the source and drain.

The point at which the recessed source/drain areas and spacers meet are generally considered the most critical and weak points of the transistor. Accordingly, there is a need for a pre-treatment process by which a conformal silicon-containing layer can be formed on the recessed source/drain areas of transistors.

SUMMARY

According to one aspect of the invention, the process for forming a silicon layer includes placing a substrate having a recessed first surface defining a wall, a second surface elevated above and adjacent to the wall of the recessed first surface and a junction between the first and second surface into a process chamber, exposing the substrate to a deposition gas containing a silicon source to blanket deposit a conformal silicon layer on the first and second surface of the substrate, thereby forming an epitaxial silicon layer on the first surface and an amorphous silicon-containing layer on the second surface. According to a further aspect, after blanket deposition, the process includes heating the substrate to promote solid phase epitaxial growth of the silicon layer and causing the epitaxial silicon layer to extend past the junction. Thereafter, the process according to one aspect of the invention includes cooling the substrate and selectively etching the amorphous silicon layer with an etching gas.

According to another aspect of the invention, a process for forming a silicon-containing layer on a substrate surface includes placing a substrate having a first monocrystalline surface defining a source/drain recess located below a second surface including a gate dielectric into a process chamber, exposing the substrate to a deposition gas to non-selectively form a conformal silicon-containing layer on the substrate where the silicon layer on the first surface has epitaxial material, the silicon-containing layer on the second surface has amorphous material, and the silicon-containing layers on each surface of the substrate form an epitaxial-amorphous interface. In a further aspect of the invention, after formation of a silicon-containing layer, the process provides for heating the substrate to promote solid phase epitaxial growth of the silicon-containing layer so that the epitaxial silicon-containing layer grows into the amorphous silicon-containing layer and elevates the epitaxial-amorphous interface to the gate dielectric. In a yet further aspect of the invention, the process includes cooling the substrate after heating and selectively etching the amorphous silicon-containing layer with an etching gas.

In a specific embodiment, the silicon source of the deposition gas includes a silane and higher order silane. According to one or more embodiments, the silane is flowed at a rate of about 10 sccm to about 500 sccm and the higher order silane is provided at a rate in the range of about 0.5 sccm to about 10 sccm. In further embodiments, a dopant source is included in the deposition gas. In at least one embodiment, the blanket deposition aspect is performed at a temperature below about 600° C.

In one or more embodiments, the process includes heating the substrate for a period of at least about 30 seconds and at a temperature greater than about 600° C. In specific embodiments, the heating step includes heating the substrate at a temperature between about 600° C. and 700° C. In a more specific embodiment, the heating step includes heating the substrate at a temperature greater than about 700° C. According to one or more embodiments, during the cooling step the substrate is cooled to a temperature less than about 600° C.

In a specific embodiment, the etching gas used in the selective etching step includes a chlorine-containing gas. In more specific embodiments, the chlorine-containing gas of some etching gases includes HCl, $Cl_2$, or combinations of HCl and $Cl_2$.

DETAILED DESCRIPTION

Figure 1:
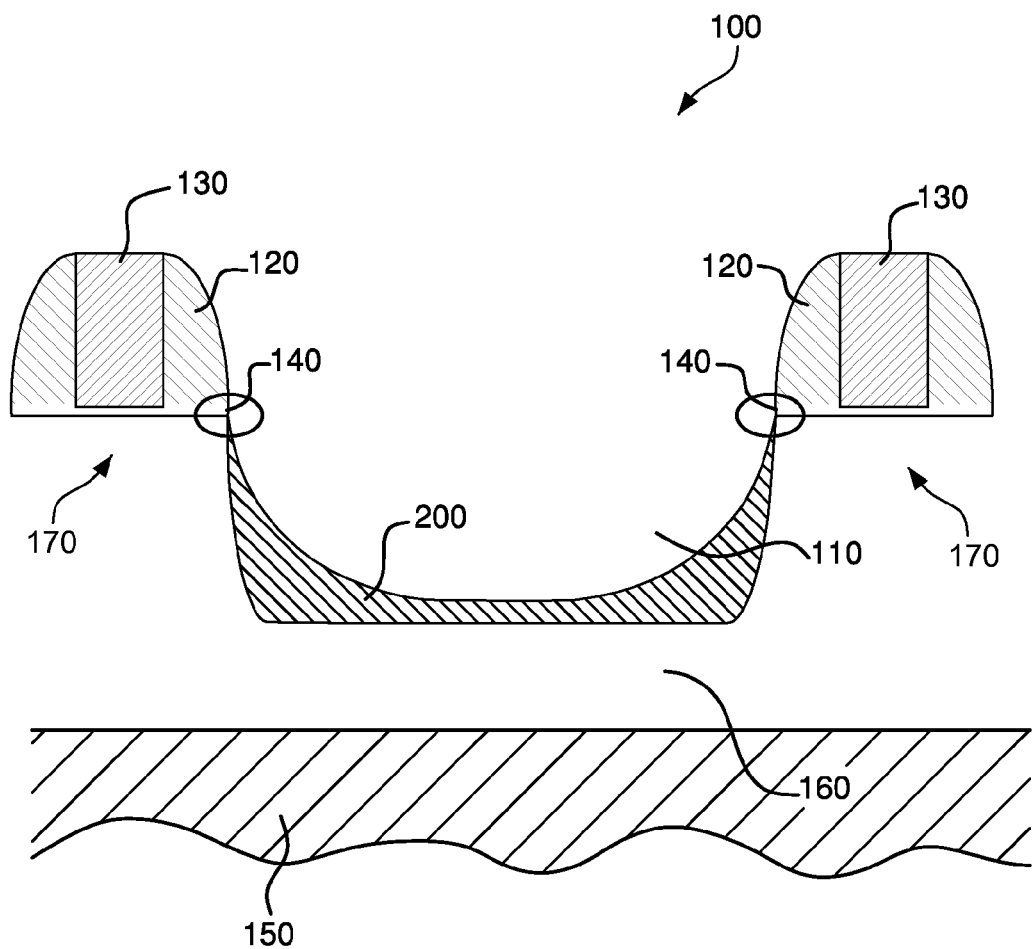
FIG. 1 is a cross-sectional view of a transistor structure having a non-conformal pre-treatment layer deposited on the structure.

Before describing several exemplary embodiments of the invention, it is to be understood that the invention is not limited to the details of construction or process steps set forth in the following description. The invention is capable of other embodiments and of being practiced or being carried out in various ways.

Embodiments of the invention generally provide processes for forming and pre-treating a silicon-containing epitaxial layer. Specific embodiments pertain to processes for forming and treating an epitaxial layer during the manufacture of a transistor.

As used herein, epitaxial deposition refers to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate. Epitaxial layers are distinguished from bulk substrates and polysilicon layers.

Throughout the application, the terms "silicon-containing" materials, compounds, films or layers should be construed to include a composition containing at least silicon and may contain germanium, carbon, boron, arsenic, phosphorus gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe for silicon germanium, Si:C for silicon carbon and SiGeC for silicon germanium carbon. The abbreviations do not represent chemical equations with stoichiometric relationships, nor represent any particular reduction/oxidation state of the silicon-containing materials.

As used herein, conformality is a film property describing how well the topography of the underlying surface is replicated. For example, a conformal film has substantially the same shape as the surface it covers and/or has substantially the same thickness throughout.

One or more embodiments of the invention generally provide pre-treatment processes to non-selectively and epitaxially deposit silicon-containing materials on monocrystalline surfaces of a substrate during fabrication of electronic devices. In other embodiments, the non-selective epitaxial deposition step is followed by a selective etch step. According to one or more embodiments, a substrate containing a monocrystalline surface (e.g., silicon or silicon germanium) and at least a secondary surface, such as an amorphous surface and/or a polycrystalline surface (e.g., oxide or nitride), is exposed to an non-selective epitaxial process to form an epitaxial layer on the monocrystalline surface and a polycrystalline or amorphous layer on the secondary surfaces. In further embodiments, the selective etch step etches away the polycrystalline or amorphous layer.

During an exemplary deposition process, an epitaxial silicon-containing layer is formed on the monocrystalline surface or first surface of the substrate, while a polycrystalline/amorphous silicon-containing layer is formed on secondary surfaces, such as dielectric, amorphous and/or polycrystalline surfaces, which will be collectively referred to as "secondary surfaces" or "second surfaces." The first surface and second surfaces form a junction on the substrate. In some embodiments, the junction is the point at which the spacer and the recessed source/drain meet. As otherwise described, the junction is believed to be one of the most critical and weak points of a transistor device.

The substrates may be unpatterned or patterned. Patterned substrates are substrates that include electronic features formed into or onto the substrate surface. The patterned substrate usually contains monocrystalline surfaces and at least one secondary surface that is non-monocrystalline, such as a dielectric, or polycrystalline surfaces. Monocrystalline surfaces include the bare crystalline substrate or a deposited single crystal layer usually made from a material such as silicon, silicon germanium or silicon carbon. Polycrystalline surfaces may include dielectric materials, such as oxides or nitrides, specifically silicon oxide or silicon nitride, as well as amorphous silicon surfaces.

To perform the deposition according to one or more embodiments, the substrate is loaded into the process chamber and the conditions in the process chamber are adjusted to a predetermined temperature and pressure. In a specific embodiment, deposition is performed at a temperature less than about 640° C., and in a more specific embodiment, deposition is performed at a temperature less than about 600° C. The temperature at which deposition is performed can be adjusted to ensure amorphous growth on the secondary surfaces, and specifically on the dielectric surface.

One or more embodiments of the present invention utilize the Epi RP Centura for the pre-treatment process. Other embodiments utilize the Epi RP Centura for subsequent processes.

The process chamber used in one or more embodiments is usually maintained at an appropriate temperature and pressure for the selected process. During the deposition process the substrate is exposed to a deposition gas to form an epitaxial layer. The substrate is exposed to the deposition gas for a period of time of about sufficient to form a layer of a desired thickness. The specific exposure time of the deposition process is determined in relation to the exposure time during a subsequent etching process, as well as particular precursors and temperature used in the process. In one or more embodiments, the substrate is exposed to the deposition gas long enough to form a maximized the thickness of an epitaxial layer In one or more embodiments, the deposition process includes exposing the substrate surface to a deposition gas containing at least a silicon source. Alternate embodiments also include carrier gas. According to one or more embodiments, the deposition gas may further include a dopant source to provide a source of a dopant, such as boron, arsenic, phosphorus, gallium and/or aluminum. In an alternative embodiment, the deposition gas may include at least one etchant, such as hydrogen chloride or chlorine.

The silicon-containing materials or silicon source used in one or more embodiments include silicon, silicon germanium, silicon carbon, silicon germanium carbon, and variants thereof, including dopants. Silicon sources useful in the deposition gas to deposit silicon-containing compounds include silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited silicon-containing compound. According to one or more embodiments, methylsilane in an argon-containing carrier gas is a preferred silicon-containing source and carrier gas combination.

According to one or more embodiments of the invention, the silicon source of the deposition gas is a silane and a higher order silane. Without being bound by theory, it is believed that although the silane produces a more conformal layer, the disilane is used as a catalyst to activate the silane. In a specific embodiment, the deposition gas includes silane at a flow rate in the range of about 10 sccm to 500 sccm and disilane at a flow rate in the range of about 0.5 sccm and 10 sccm. In a more specific embodiment, the deposition gas includes silane at a flow rate in the range of about 100 sccm to about 300 sccm and disilane at a flow rate of about 1 sccm to about 5 sccm. In an even more specific embodiment, the deposition gas includes silane at a flow rate of about 200 sccm and disilane at a flow rate of about 2 sccm. More than one embodiment, provides for maintaining a higher partial pressure for the silane.

The silicon source is usually provided into the process chamber along with a carrier gas. The carrier gas may have a flow rate from about 1 slm (standard liters per minute) to about 100 slm, for example, from about 5 slm to about 75 slm, and more specifically from about 10 slm to about 50 slm, for example, about 10 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process. Usually the carrier gas is the same throughout for each of the deposition and etching steps. However, some embodiments may use different carrier gases in particular steps.

Typically, nitrogen is utilized as a carrier gas in embodiments featuring low temperature (e.g., <800° C.) processes. Low temperature processes are accessible due in part to the use of chlorine gas in the etching process. Nitrogen remains inert during low temperature deposition processes. Therefore, nitrogen is not incorporated into the deposited silicon-containing material during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface inhibit the growth rate of silicon-containing layers. Finally, the low temperature processes may take economic advantage of nitrogen as a carrier gas, since nitrogen is far less expensive than hydrogen, argon or helium. Despite the economic advantages, according to certain embodiments, argon is a preferred carrier gas.

The deposition gas used during deposition may further include at least one dopant compound to provide a source of elemental dopant, such as boron, arsenic, phosphorus, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In one example, the silicon-containing compound is doped p-type, such as by using diborane to add boron. In another example, the silicon-containing compound is doped n-type, such as with phosphorus and/or arsenic.

A dopant source is usually provided into the process chamber during deposition at a rate in the range from about 0.1 sccm to about 20 sccm, for example, from about 0.5 sccm to about 10 sccm, and more specifically from about 1 sccm to about 5 sccm, for example, about 2 sccm. Boron-containing dopants useful as a dopant source include boranes and organoboranes. Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3$)$_3B$), dimethylborane (($CH_3$)$_2BH$), triethylborane (($CH_3CH_2$)$_3B$) and diethylborane (($CH_3CH_2$)$_2BH$). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$).sub.3P), dimethylphosphine (($CH_3$)$_2PH$), triethylphosphine (($CH_3CH_2$).sub.3P) and diethylphosphine (($CH_3CH_2$)$_2PH$). Aluminum and gallium dopant sources may include alkylated and/or halogenated derivates, such as described with the empirical formula $R_xMX_{(3-x)}$, where M=Al or Ga, R=methyl, ethyl, propyl or butyl, X=Cl or F and x=0, 1, 2 or 3. Examples of aluminum and gallium dopant sources include trimethylaluminum ($Me_3Al$), triethylaluminum ($Et_3Al$), dimethylaluminumchloride ($Me_2AlCl$), aluminum chloride ($AlCl_3$), trimethylgallium ($Me_3Ga$), triethylgallium ($Et_3Ga$), dimethylgalliumchloride ($Me_2GaCl$) and gallium chloride ($GaCl_3$).

After a silicon-containing layer is deposited on the substrate, the substrate is heated or what is often referred to as "baked" to promote solid phase epitaxial growth in accordance with some embodiments. In a specific embodiment, the substrate can be baked to a temperature greater than about 600° C. In another specific embodiment, the substrate is baked to a temperature greater than about 700° C. In a more specific embodiment, the substrate is baked to a temperature between about 600° C. and about 700° C. In at least one embodiment, no active gases are flowing to the chamber during baking.

Without being bound by theory, it is believed that baking the substrate causes solid phase epitaxy at the region at which the polycrystalline and monocrystalline surfaces meet. As a result, the epitaxial silicon-containing layer grows into the amorphous silicon-containing layer, beyond the junction between the first surface and the second surface. This results in a conformal epitaxial silicon-containing layer above the junction. While still not wishing to be bound by theory, it is believed that the conformal epitaxial silicon-containing layer reinforces the junction and eliminates the weakness where the spacer and recess meet.

It is also believed that baking also causes the amorphous silicon-containing layer to crystallize and form polycrystalline film. However, it is also believed that the rate of such crystallization can be reduced by controlling the temperature. As will be more fully discussed below, the reduced rate of crystallization allows the etching gas to remove the amorphous silicon-containing layer at a faster rate than the epitaxial silicon-containing layer.

In other embodiments, the epitaxial silicon-containing layer disposed on the first surface and the amorphous layer disposed on the secondary surfaces form an epitaxial-amorphous interface. Without being bound by theory, it is believed that by heating the substrate, the epitaxial silicon-containing layer grows into the amorphous silicon-containing layer, thereby elevating the epitaxial-amorphous interface to the second surface. In specific embodiments, the epitaxial-amorphous interface is elevated to the gate dielectric of the second surface as a result of the heating step.

According to one or more embodiments, the substrate is baked to promote epitaxial growth for a period in the range of about 30 seconds to about 5 minutes. In a more specific embodiment, the substrate is baked for about 2 minutes. In one or more embodiments, the substrate is then immediately cooled. In a specific embodiment, the substrate is cooled to a temperature less than 600° C.

In at least one embodiment of the invention, the substrate is exposed to an etching gas after being cooled. The etching gas removes silicon-containing materials deposited during the deposition process. During the etching process, the polycrystalline/amorphous layer is removed at a faster rate than the epitaxial layer. Therefore, the net result of the deposition and etching processes forms epitaxially grown silicon-containing material on monocrystalline surfaces while minimizing growth, if any, of polycrystalline/amorphous silicon-containing material on the secondary surfaces. A cycle of the deposition and etching processes may be repeated as needed to obtain the desired thickness of silicon-containing materials. The etching gas, according to one or more embodiments, includes a carrier gas and an etchant. In a specific embodiment, the etchant includes a chlorine-containing gas, such as chlorine gas or hydrogen chloride.

The process conditions can be modified to the temperature required for the etchant to become active. The use of chlorine gas as an etchant lowers the overall process temperature. In general, deposition processes may be conducted at lower temperatures than etching reactions, since etchants often need a high temperature to be activated. For example, silane may be thermally decomposed to deposit silicon at about 500° C. or less, while hydrogen chloride requires a higher activation temperature to act as an effective etchant. Therefore, if hydrogen chloride is used during a process, the overall process temperature is dictated by the higher temperature required to activate the etchant. Chlorine contributes to the overall process by reducing the required overall process temperature. Chlorine may be activated at a temperature as low as about 500° C. Therefore, by incorporating chlorine into the process as the etchant, the overall process temperature may be significantly reduced, such as by about 200° C. to 300° C., over processes which use hydrogen chloride as the etchant.

Also, chlorine etches silicon-containing materials faster than hydrogen chloride. Therefore, without being bound by theory, it is believed that chlorine etchants increase the overall rate of the process.

In accordance with one or more embodiments, the pre-treatment includes multiple alternating steps of deposition, heating, cooling, etching and purging to obtain the proper thickness of the epitaxial layer and/or growth of the epitaxial layer up the sidewalls.

According to one or more embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products and other contaminants.

According to one or more embodiments, the methods follow a sequential order, however, the process is not limited to the exact steps described herein. For example, other process steps can be inserted between steps as long as the order of process sequence is maintained. Further, the pre-treatment can be followed by process for forming epitaxial layers known in the art.

The individual steps of an epitaxial deposition will now be described according to one or more embodiments. Referring now to FIG. 1, shows the resulting epitaxial layer from a pre-treatment process which selectively grows a silicon-containing layer in the recess source/drain. FIG. 1 shows a cross sectional view of a FET pair in a typical MOSFET device 100. The device can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 150, for example, a silicon substrate, which may be doped with a p-type material, a p-type epitaxial silicon layer 160 on substrate 150, after forming a well or recessed area 110 to provide a source/drain region 110, gate dielectric 120, and gate electrode 130. Channel regions 170 are defined between the source/drain regions. The points at which the source/drain region and dielectric meet form junctions 140. The selectively grown epitaxial layer 200 is deposited only in the recessed source/drain region 110. The epitaxial layer is non-conformal as a greater amount of the silicon-source is deposited at the bottom of the well, resulting in an epitaxial layer have greater thickness at the bottom. Further, the junctions 140 are exposed and uncovered.

Figure 2:
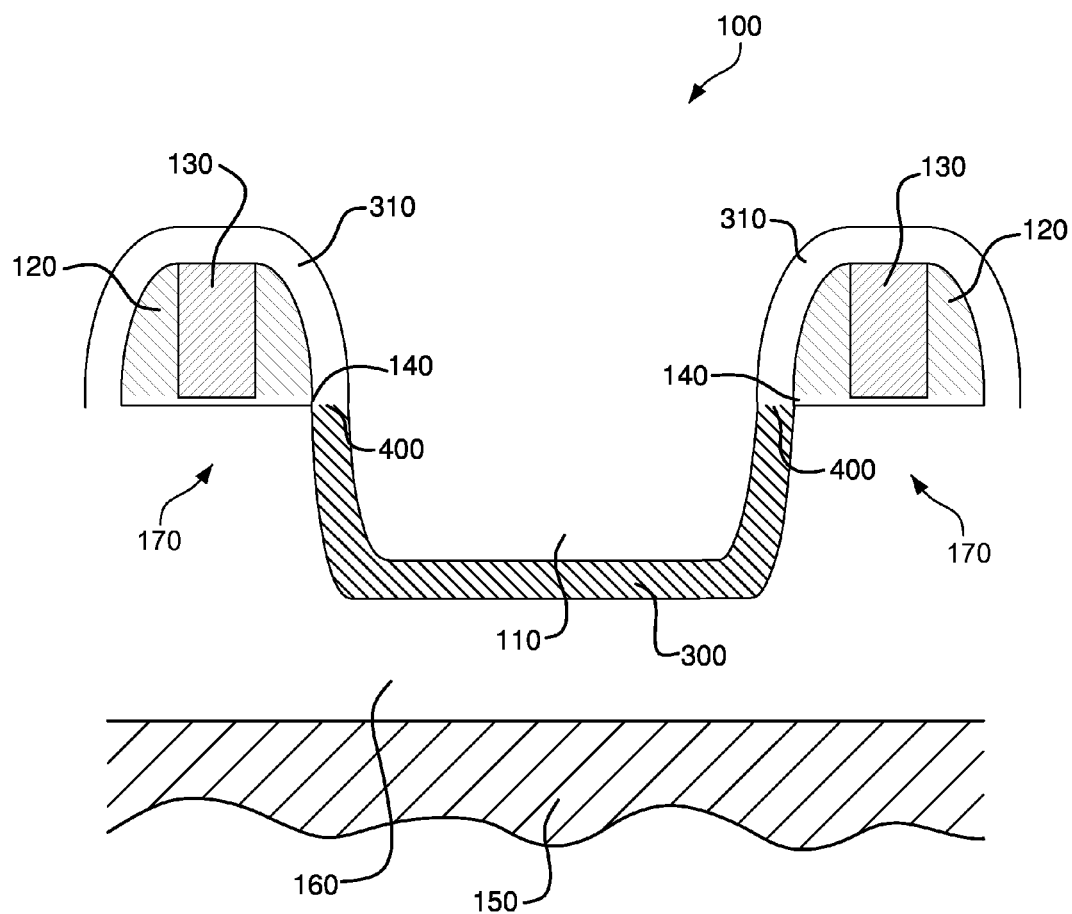
FIG. 2 shows a cross-sectional view a conformal silicon-containing layer on the source/drain recess and channel regions of a transistor, including the gate dielectric, gate electrode, using non-selective deposition according to an embodiment of the invention.

Similar to FIG. 1, FIG. 2 shows a cross sectional view of a FET pair in a typical MOSFET device 100 having a semiconductor substrate after forming a well or recessed area to provide a recessed source/drain region 110, gate dielectric 120, gate electrode 130 and junctions 140 at which the source/drain region and dielectric meet. However, FIG. 2 illustrates the conformal layer formed which results from the deposition step of a non-selective epitaxy process for pre-treating the recessed source/drain. The resulting layer is uniformly distributed and forms an epitaxial layer 300 and amorphous layer 310 having substantially the same thickness. The conformal epitaxial layer and amorphous layer form an interface 400.

Figure 3:
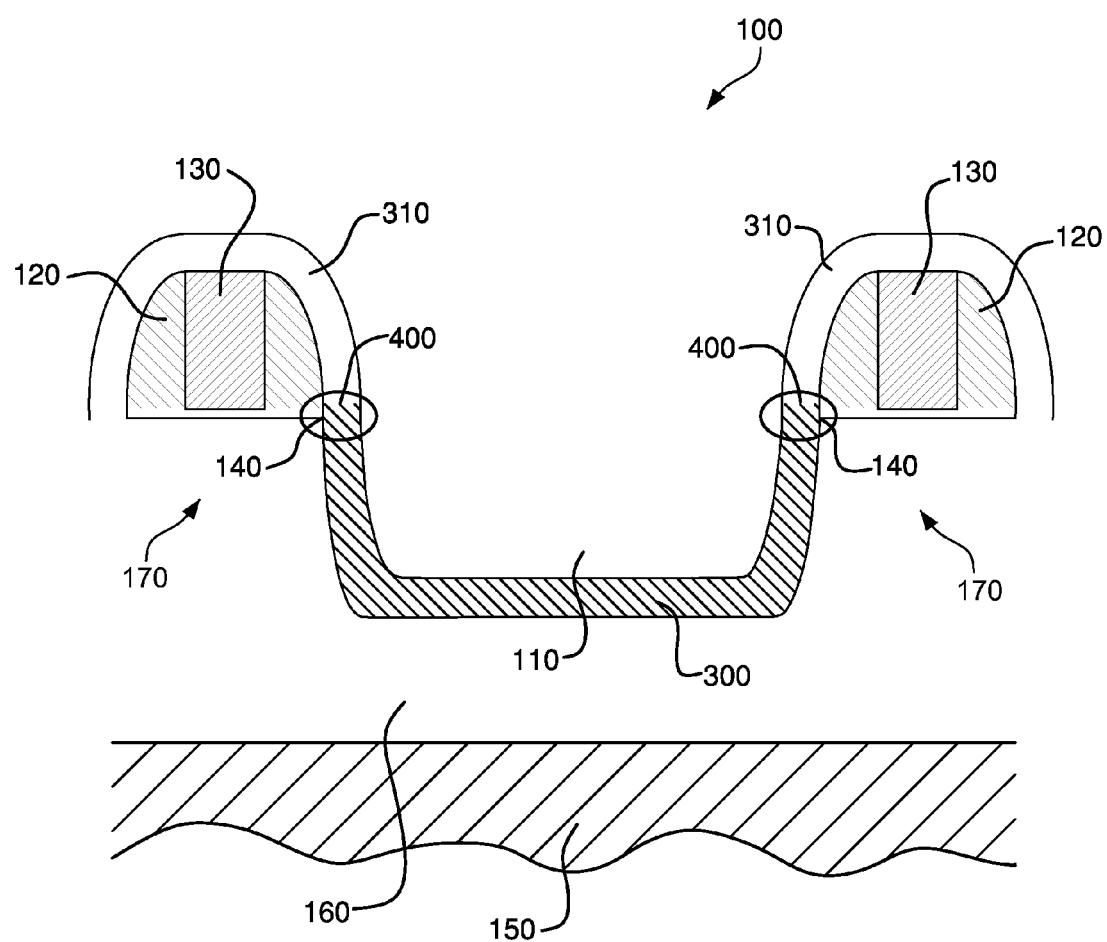
FIG. 3 is a view of a transistor showing the growth of the epitaxial silicon-containing layer in FIG. 2 according to an embodiment of the invention.

FIG. 3 illustrates the result of heating the substrate to a temperature above 600° C. The heating step promotes solid phase epitaxial growth, whereby the epitaxial layer 300 grows up the sidewalls of the recessed source/drain 110 past the junctions 140. Further, epitaxial layer and amorphous layer interface 400 is elevated to the gate dielectrics 120. In contrast to FIG. 1, the epitaxial layer of FIG. 3 is conformal throughout, including at the junctions, thereby providing a uniform barrier or reinforcement at the one of the weak points of the device.

Figure 4:
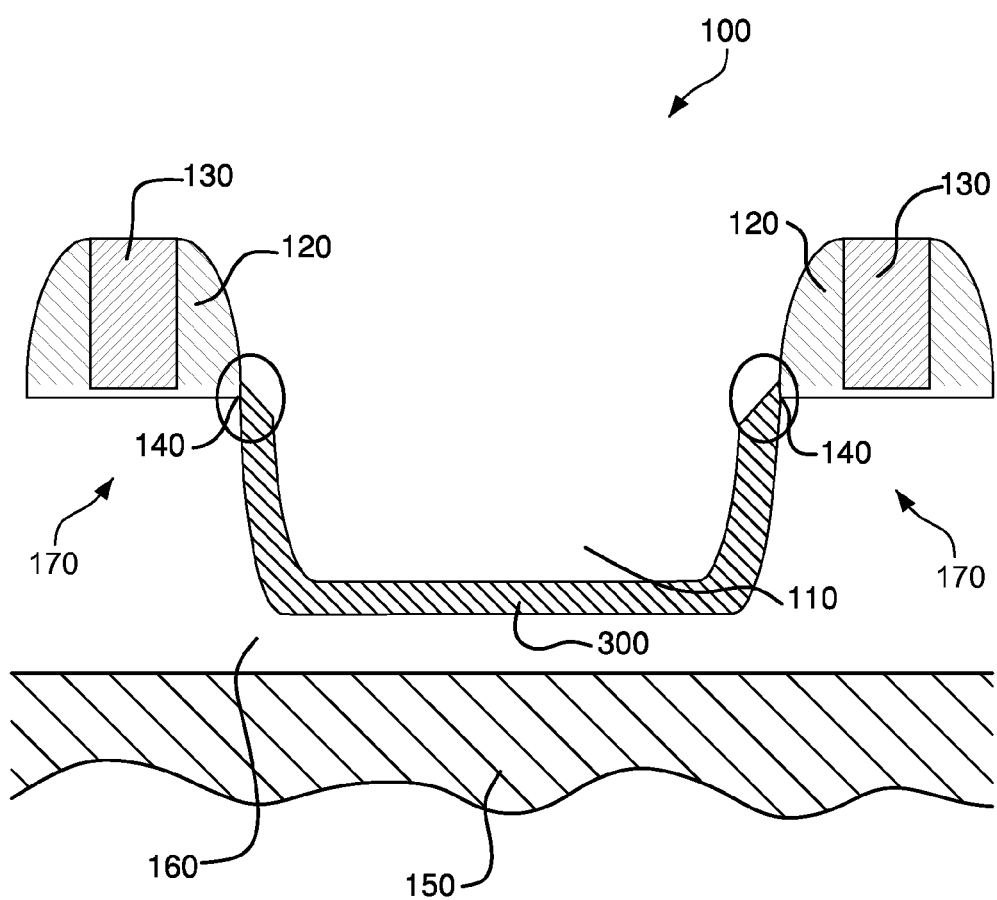
FIG. 4 shows the resulting silicon-containing layer shown in FIG. 3 after an etching gas etches away the amorphous silicon-containing layer of an embodiment of the invention.

FIG. 4 shows the epitaxial layer which results after the substrate is etched with an etchant. The etchant removes the amorphous layer, leaving behind a conformal epitaxial layer 300 within the recessed source/drain 110 and an epitaxial layer 300 which extends over and covers the junctions 140. The epitaxial layer which extends over and covers the junctions in FIG. 4 is thicker than the epitaxial layer near or on the junctions in FIG. 1. The coverage provided by the epitaxial layer in FIG. 4 eliminates the weak points in the device which exist at the junctions in the prior art.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A process for forming a silicon-containing layer on a substrate surface comprising:
   placing a substrate into a process chamber, the substrate including a recessed first surface defining a wall and a second surface elevated above and adjacent to the wall of the recessed surface and a junction between the first surface and second surface;
   blanket depositing a conformal silicon layer on the first surface and on the second surface by exposing the substrate to deposition gas comprising a silicon source, wherein the silicon layer deposited on the first surface comprises epitaxial material and the silicon layer deposited on the second surface comprises amorphous material;
   heating the substrate to promote solid phase epitaxial growth of the silicon-containing layer and causing an epitaxial silicon layer to extend past the junction;
   cooling the substrate; and
   selectively etching an amorphous silicon layer with an etching gas.

2. The process of claim 1, wherein the silicon source of the deposition gas comprises silane and a higher order silane.

3. The process of claim 2, wherein the silane is flowed at a rate in the range of about 10 sccm to about 500 sccm and the higher order silane is flowed at a rate in the range of about 0.5 sccm to about 10 sccm.

4. The process of claim 1, wherein the deposition gas further comprises a dopant source.

5. The process of claim 1, wherein the blanket depositing is performed at a temperature below about 600° C.

6. The process of claim 1, wherein the heating the substrate to promote epitaxial growth occurs for a period of at least about 30 seconds.

7. The process of claim 1, wherein the heating the substrate to promote epitaxial growth occurs at a temperature greater than about 600° C.

8. The process of claim 1, wherein heating the substrate to promote epitaxial growth occurs at a temperature greater than about 600° C. and less than about 700° C.

9. The process of claim 1, wherein heating the substrate to promote epitaxial growth occurs at a temperature greater than about 700° C.

10. The process of claim 1, wherein the substrate is cooled to a temperature of less than about 600° C.

11. The process of claim 1, wherein the etching gas comprises a chlorine-containing gas.

12. The process of claim 11, wherein the chlorine-containing gas comprises HCl, $Cl_2$ or combinations thereof.

13. A process for forming a silicon-containing layer on a substrate surface comprising:
   placing a substrate including a first surface and a second surface into a process chamber, wherein the first surface is a monocrystalline surface defining a source/drain recess located below the second surface and the second surface comprising a gate dielectric;
   non-selectively depositing a conformal silicon-containing layer on the first surface and second surface by exposing the substrate to deposition gas comprising a silicon source, wherein the silicon-containing layer deposited on the first surface comprises epitaxial material, the silicon-containing layer deposited on the second surface comprises amorphous material and the silicon-containing layers deposited on the first surface and the second surface form an epitaxial-amorphous interface having a substantially uniform thickness;
   heating the substrate to promote solid phase epitaxial growth of the silicon-containing layer wherein the epitaxial silicon-containing layer grows into the amorphous silicon-containing layer and elevates the epitaxial-amorphous interface to the gate dielectric;
   cooling the substrate; and
   selectively etching the amorphous silicon-containing layer with an etching gas thereby leaving a conformal epitaxial silicon-containing layer covering the recessed wall and at least a portion of the gate dielectric.

14. The process of claim 13, wherein the silicon source of the deposition gas comprises silane and a higher order silane.

15. The process of claim 13, wherein the silane is flowed at a rate in the range of about 10 sccm to about 500 sccm and the higher order silane is flowed at a rate in the range of about 0.5 sccm to about 10 sccm.

16. The process of claim 13, wherein the deposition gas further comprises a dopant source.

17. The process of claim 13, wherein heating the substrate to promote epitaxial growth occurs for a period of at least about 30 seconds.

18. The process of claim 13, wherein heating the substrate to promote epitaxial growth occurs at a temperature greater than about 600° C. and less than about 700° C.

19. The process of claim 13, wherein heating the substrate to promote epitaxial growth occurs at a temperature greater than about 700° C.

20. The process of claim 13, wherein the silicon-containing layer is formed during a fabrication step of a transistor manufacturing process comprising the steps of:
   forming a gate dielectric on a substrate;
   forming a gate electrode on the gate dielectric;
   forming source/drain regions on the substrate on opposite sides of the gate electrode; and
   defining a channel region between the source/drain regions.

* * * * *